(12) United States Patent
Sato et al.

(10) Patent No.: US 7,388,269 B2
(45) Date of Patent: Jun. 17, 2008

(54) DIODE WITH LEAD TERMINAL FOR SOLAR CELL

(75) Inventors: Hirofumi Sato, Kyoto (JP); Kazunari Sato, Kyoto (JP); Koichi Fujii, Kyoto (JP)

(73) Assignee: Angel Co., Ltd., Kyoto-Shi, Kyoto (JP)

( * ) Notice: Subject to any disclaimer, the term of this patent is extended or adjusted under 35 U.S.C. 154(b) by 119 days.

(21) Appl. No.: 11/587,062

(22) PCT Filed: May 19, 2005

(86) PCT No.: PCT/JP2005/009156

§ 371 (c)(1),
(2), (4) Date: Oct. 20, 2006

(87) PCT Pub. No.: WO2005/112133

PCT Pub. Date: Nov. 24, 2005

(65) Prior Publication Data

US 2007/0221919 A1    Sep. 27, 2007

(30) Foreign Application Priority Data

May 19, 2004 (JP) ............................. 2004-149057

(51) Int. Cl.
*H01L 31/0203* (2006.01)
(52) U.S. Cl. .................. 257/433; 257/443; 136/251
(58) Field of Classification Search .............. 257/44, 257/433, 443, 458, 459, 690; 136/251
See application file for complete search history.

(56) References Cited

U.S. PATENT DOCUMENTS 6,218,606 B1   4/2001   Morizane et al.
6,316,832 B1   11/2001  Tsuzuki et al.

FOREIGN PATENT DOCUMENTS

| JP | 2000-164910 | 6/2000 |
|----|-------------|--------|
| JP | 2000-196128 | 7/2000 |
| JP | 2000-243995 | 9/2000 |
| JP | 2000-277785 | 10/2000 |
| JP | 2001-298134 | 10/2001 |
| JP | 2002-246628 | 8/2002 |
| JP | 2002-252356 | 9/2002 |
| JP | 2003-347573 | 12/2003 |
| JP | 2004-311671 | 11/2004 |
| JP | 2005-005308 | 1/2005 |

*Primary Examiner*—Thien F Tran
(74) *Attorney, Agent, or Firm*—Manabu Kanesaka

(57) ABSTRACT

A diode such as a cell string bypass diode or a reverse-current preventive diode exhibiting excellent heat dissipativity and preferably sealed integrally in a solar cell module. An N terminal (11) consists thickness part of 0.8 mm or above, i.e. an N substrate part (12), one thin part, i.e. an N thin part (13), and a P connecting wire receiving part (24). In a state where a diode chip (31) is connected, the thicknesses of the entire lead terminals are substantially the same, the total value of the plane area of the N substrate part and the P substrate part is 200 (mm)$^2$ or above, and the diode with a lead terminal is sealed together with the solar cell between the front surface material and the rear surface material for sealing the solar cell.

13 Claims, 8 Drawing Sheets

DIODE WITH LEAD TERMINAL FOR SOLAR CELL

TECHNICAL FIELD

The present invention relates to a diode with lead terminals preferable as a bypass diode for bypassing a reverse voltage directed to a cell string in which a plurality of solar cells are connected in series and as a reverse-current preventive diode for preventing electric current from flowing into one cell string from other cell strings in a plurality of cell strings connected in parallel.

BACKGROUND ART

A solar cell array has groups of solar cells (hereinafter called "cell string") in which a plurality of solar cells are connected in series, bypass diodes (hereinafter called "CST bypass diode") that are connected to each of the groups in parallel, and reverse-current preventive diodes that are connected to one or more cell strings in series.

FIG. 1 is an illustration of the circuit of a solar cell array. A solar cell array 91 contains a cell string 92a in which a plurality of cells (95a1, 95a2, and 95an) are connected in series and a cell string 92b in which a plurality of cells (95b1, 95b2, and 95bn) are connected in series in the same way. CST bypass diodes 93a and 93b are connected to the cell strings 92a and 93b in parallel, respectively. In addition, CST bypass diodes 93c and 93d are connected to other cell strings 92c and 92d in parallel, respectively. A reverse-current preventive diode 94p is connected to the cell strings 92a and 92b in series. A reverse-current preventive diode 94q is connected to the cell strings 92c and 92d in series in the same way. Bypass diodes for a single cell (96a1, 96a2, 96an, 96b1, 96b2, and 96bn) are placed to protect each cell from reverse current. Said bypass diodes for a single cell may be omitted.

In conventional approaches, there have been proposed solar cell modules in which a CST bypass diode, together with a plurality of solar cells, is integrally sealed between the front surface member and the rear surface member of the modules. The CST bypass diode for the proposed solar cell modules comprise a bear chip diode, an attaching section having conductive members arranged on each side of the bear chip diode (such conductive members constitute a mounting surface), and a base unit made from materials with excellent heat dissipativity, which base unit is arranged together with the attaching section outside the bear chip diode (refer to the patent document 1, for example).

Furthermore, a diode in which the upper surface and the under surface of the diode with lead terminals connected are arranged almost on the same plane has been proposed as a bypass diode for a single solar cell (refer to the patent document 2, for example).

Patent document 1: Japanese Patent Laid-Open No. 2000-164910 bulletin
Patent document 2: Japanese Patent Laid-Open No. 2000-277785 bulletin

DISCLOSURE OF THE INVENTION

Objects to be Achieved

Conventional CST bypass diodes and reverse-current preventive diodes are often arranged in a terminal box for solar cells separate from the solar cell module. Integral sealing of the CST bypass diode and the reverse-current preventive diode in the solar cell module in which a plurality of thin plate-shaped solar cells are sealed together with a front surface member made of transparent glass or resin and a rear surface member made of comprising transparent or opaque glass or resin, enable the solar cell module to thin down conveniently.

With rapid advances in solar cell technology, single solar cell modules with a maximum output of approximately 190 W and a nominal short-circuit current of approximately 8 A have recently been used widely. The high-power solar cell modules require CST bypass diodes with a large electric capacity in order to bypass electric current directed to cell strings in the modules. This causes a large amount of heat to be generated when an electric current flows through the CST bypass diode. Furthermore, reverse-current preventive diodes need to have much larger electric capacity for the high-power solar cell modules, thus generating much more heat.

High temperature in the CST bypass diode and/or the reverse-current preventive diode often causes poor connection between the diode chip and the lead terminal, malfunction of the diode chip, and discoloration of sealing members such as EVA, thereby leading to failure of the solar cell module.

Application of the conventional CST bypass diodes to high-power solar cell modules recently available requires larger capacity of diodes and effective measures for heat release. In particular, the diodes that are sealed integrally in the solar battery module are generally surrounded by sealing members with poor heat conductance such as EVA resin. Solar cell modules themselves also are heated by sunlight. These factors prevent the heat from being released to the surrounding area. Therefore, the solar cell modules that have CST bypass diodes integrally sealed therein have hardly been commercialized or put into practical use because of a structure for effective heat release being needed.

A bypass diode for a single cell described in the patent document 2 has a low electric capacity and is arranged on top of the solar cell, which in this case act just like a radiator plate. Therefore, application of said bypass diode as a CST bypass diode or a reverse-current preventive diode also requires other measures for heat release.

Accordingly, it is an object of the present invention to provide a CST bypass diode and a reverse-current preventive diode that are preferably sealed integrally in a solar cell module. It is another object of the present invention to provide a solar cell module in which a CST bypass diode and a reverse-current preventive diode are integrally sealed. It is still another object of the present invention to provide a terminal box for solar cells in which a CST bypass diode and a reverse-current preventive diode, both having excellent heat dissipativity, are arranged. Other objects of the present invention will become clear from the explanation of the present invention described below.

MEANS TO ACHIEVE THE OBJECTS

The present inventors studied and made repeated experiments to obtain a CST bypass diode and a reverse-current preventive diode that are placed in a high-power solar cell module. Their efforts, in particular, to increase electric capacity of the diodes and to clarify and solve problems arising from sealed solar cell modules resulted in the preset invention.

The outline of the study and experiments will be described below:

Integral sealing of the CST bypass diode and the reverse-current preventive diode in the solar cell module forces these diodes to be arranged in sealing members such as EVA with poor heat conductance and also causes the sealing members to be heated by sunlight. In order to release heat generated in the diode element via said sealing members, the lead terminal, which acts as a radiator plate, must have an area enough for the heat to be conducted to the whole lead terminal. In other words, thin plate-shaped lead terminals cannot release heat adequately, and lead terminals, if they act as a radiator plate, must have a sufficient area.

The conditions mentioned above force the lead terminals to thicken out, resulting in increasing rigidity of the lead terminals. CST bypass diodes and reverse-current preventive diodes are generally connected by means of soldering of jumper cables, and connecting of the lead terminals with the jumper cables causes the connected portion to thicken out. There is another problem in that if the diode with lead terminals, which is sealed in the solar cell module, is of uneven thickness, the force on such uneven portion attributable to torsion and local deformation applied to the solar cell by wind, etc. module cannot be absorbed sufficiently in the lead terminals, and as a result, such unabsorbed force is directly transmitted to the connected portion of the diode chip and the lead terminal, resulting in such portion being damageable.

In addition, the present inventors verified the possibility of restraining the temperature of the diode chip from rising using a plurality of diodes chips connected in parallel, even in the sealing members where it is often difficult to release heat.

A diode with lead terminals of an embodiment of the present invention is a diode with lead terminals used as a bypass diode connected in parallel to a cell string in which m solar cell cells (m is a positive integer of 2 or more) are connected in series via a conductor or as a reverse-current preventive diode connected in series to said n cell strings (n is a positive integer of 1 or more), comprising, an N terminal having an almost square-shaped, plate-like portion of even thickness of 0.8 mm or more, at each end of which a thin part is formed, said portion of uniform thickness being an N substrate part, and said thin part at one end being an N thin part and said thin part at the other end being an N connecting wire receiving part, and the under surface of the N substrate part and the under surface of the N thin part forming the same plane, a P terminal having an almost square-shaped, plate-like, electrically conductive portion as thick as the N substrate part, at each end of which a thin part is formed, said portion of even thickness being a P substrate part, and said thin part at one end being a P thin part, said thin part at the other end being a P connecting wire receiving part, and the upper surface of the P substrate part and the upper surface of the P thin part forming the same plane, and a flat plate-shaped diode chip with a pn connection structure in which a flat plate-shaped P-type semiconductor is connected to a flat plate-shaped N-type semiconductor, wherein the electrode surface of the N-type semiconductor of said diode chip is connected to the upper surface of the N thin part of the N terminal and the electrode surface of the P type semiconductor of said diode chip is connected to the under surface of the P thin part, and in the state where said diode chip is connected, the overlapped portion of the N thin part, the diode chip, and the P thin part has almost the same thickness as that of the N substrate part, and the total of the plane area of said N substrate part and that of the P substrate part is 200 mm$^2$ or more.

For the diode with lead terminals of the present invention, the N substrate part and the P substrate part, both of which act also as a radiator plate, have large cross section, and the N substrate part has a thickness of 0.8 mm or more to facilitate the heat movement within the N substrate part and the P substrate part. The total of the plane area of the N substrate part and that of the P substrate part is 200 mm$^2$ or more. These arrangements allow the heat generated in the diode chip to be effectively transmitted to the whole lead terminals. As a result, the whole lead terminals can act as a radiator plate.

Furthermore, because the thin part is formed as a connecting wire receiving part at the lead terminal, when the jumper cable is connected, the connected part has almost the same thickness as that of the main body of the diode with lead terminals. This enables the jumper cable connecting part to locally receive less deformation force on the diode with lead terminals caused by torsion or deformation of the solar cell module. Furthermore, even in the case that the diodes with lead terminals, together with the solar cells, are sealed in the solar cell modules, viscous sealing members can be uniformly distributed around the lead terminals, thereby making the sealing work easy.

The diode with lead terminals may have a linear shape where an N terminal and a P terminal have a long side in the same direction, or may have a bended shape where the long side of the N terminal and the long side of the P terminal cross in a certain degree of angle.

In a preferred embodiment of the diodes with terminals of the present invention, said thin parts of said N terminal and/or said P terminal may be formed by means of etching. According to this preferred embodiment, the diode connecting part (the N and P thin parts) and the connection wire connecting part (the N and P connecting wire receiving parts) are formed with no stress received. Therefore, this formation is more effective in keeping the strength of the border area between the substrate part and the thin part of the diode with lead terminals than the formation by means of rolling. Furthermore, it is lower in production cost than die casting.

However, in the diode with lead terminals of the present invention, said thin part may be formed by means of rolling or by means of die casting.

In another preferred embodiment of the diode with terminals of the present invention, electric insulating members may be added to the side of said diode chip. According to this preferred embodiment, short circuit is prevented from being caused by dust between the side of the diode chip and the N terminal or the P terminal. In addition, the creepage distance may become long, thereby enhancing the electrical insulation between the N terminal and the P terminal. Furthermore, the diode chip may be protected from mechanical shock. In the case of using such diode chip that has the thin film made from glass formed at the connecting side of an N-type semiconductor and a P-type semiconductor, this preferred embodiment is particularly effective for protecting the glass made thin film.

Applying of this preferred embodiment to the diodes with lead terminals with a large electric capacity makes it more preferable. Electric insulating members may include molding members such as PPS and silicon rubber and coating materials (paints containing ceramic particles, viscous materials containing silicon, and the like are preferable).

The solar cell module of one embodiment of the present invention is a solar cell module in which the diodes with lead terminals of the present invention, together with said solar cell, are sealed between a front surface material and a rear surface material where said solar cell is to be sealed. The solar cell module of the present invention is less subject to failure caused by the heat generated in the diode.

In most cases, said solar cell module has no need for terminal box for receiving its output, while in some cases, it needs only a small terminal box that is used only for connecting an external connecting cable. This permits the saving of the space where the solar cell module is mounted. The possibility of no necessity of terminal box, as described above, makes said solar cell module particularly preferable as a type of module transmitting part of sunlight (a certain area of the plane of the solar cell module acts as a solar cell and the other area transmits the outside light).

In general, the diode with lead terminals are arranged apart from the solar cell and connected to the cell string via the jumper cable. However, the diode with lead terminals and the solar cell may be arranged immediately so that the diode with lead terminals and the solar cell can be electrically connected using no jumper cable.

The terminal box for solar cell of one embodiment of the present invention is a terminal box for solar cell in which the diodes with lead terminals of the present invention are arranged and act as said bypass diode and/or said reverse-current preventive diode.

In general, the inside of the package of the terminal box for solar cells, to which terminal box the bypass diode and/or the reverse-current preventive diode are connected, is sealed as waterproof with silicon resin, etc. This means that said diodes are surrounded with members with poor heat conductance, just like the case where diodes are sealed in the solar module. Therefore, the terminal box for solar cell for which the diodes with lead terminals of the present invention for heat release are used, has less problems arising out of heat generated in the diodes. The plate-like shape of the diode with lead terminals of the present invention enables the package of the terminal box for solar cell to become thin, allowing the saving of resin sealing materials and of materials for the package.

In a preferred embodiment of the solar cell module of the present invention, two or more diode with lead terminals of the present invention may be connected in parallel to the place of said single bypass diode and/or said single reverse-current preventive diode in parallel. Parallel connecting of two or more diodes at the single connecting part inhibits the diode chip from being heated, thereby curbing the rise in temperature of the diode chip. Therefore, the solar cell module has less problems arising out of heat generated in the diode.

In a preferred embodiment of the terminal box for solar cell module of the present invention, two or more diode with lead terminals of the present invention may be connected to the connecting part of said single bypass diode and/or said single reverse-current preventive diode in parallel. Parallel connecting of two or more diodes at the single connecting part inhibits the diode chip from being heated, thereby curbing the rise in temperature of the diode chip. Therefore, the terminal box for solar cell modules has less problems arising out of heat generated in the diode.

A parallel connecting diode with lead terminals of another embodiment of the present invention comprises:

a flat plate-shaped conductive N terminal of even thickness, having an N bridge part extending in the forward and backward directions and a plurality of N substrate parts extending from the N bridge part in the right and left direction with an N thin part at each end thereof, the under surface of the N substrate part and the under surface of the N thin part forming the same plane, a flat plate-shaped conductive P terminal of the same thickness as the N substrate part, having a P bridge part extending in the forward and back directions and the same quantity of P substrate parts as that of the N substrate part extending from the P bridge part in the right and left direction with a P thin part at each end thereof, the upper surface of said P substrate part and the upper surface of the P thin part forming the same plane, and the same quantity of flat plate-shaped diode chips as that of the N substrate part, with a pn connecting structure in which a flat plate-shaped P-type semiconductor is connected to a flat plate-shaped N-type semiconductor, wherein the N thin part and the P thin part face to each other, the electrode surface of the N-type semiconductor of one of the said diode chips being connected to the upper surface of the N thin part, and the electrode surface of the P-type semiconductor of one of the said diode chips being connected to the under surface of the P thin part; and in the state where said diode chips are connected, the overlapped portion of the N thin part, the diode chip, and the P thin part has almost the same thickness as that of the N substrate part.

Parallel connecting of the diode chips restrains the parallel connecting diode with lead terminals of the present invention from being heated and, in addition, spreads out heat generation sources, thereby making it easy to release heat. Pre-connecting of the diode chips to a single lead terminal in parallel makes it easy to implement them to electric parts such as solar cell modules. Furthermore, because the plane thickness of the parallel connecting diode with lead terminals is even, the whole diode can hold out against the deformed force that may be unexpectedly applied to the diode during operation.

The number of diode chips connected to a parallel connecting diode with lead terminals may be two or more, and there is no upper limit to the number. In practical use, the number of said diode chips are usually 50 or less, preferably 5 or less, more preferably 3 or less. In consideration of the cost-effectiveness, the most preferable number of said diode chips is 2.

There is no particular restriction on the length in the backward and forward directions of the N bridge part and the P bridge part. Also acceptable is the formation of the N terminal and the P terminal shaped like a fan, in which a bridge part is placed at the pivot, while an N substrate part and an N thin part and a P substrate part and a P thin part are placed like the ribs.

The under surface of the N connecting wire receiving part may be at the same plane as that of the under surface of the N substrate part or a little above that of the under surface of the N substrate part. Preferably, however, it is at the same plane as that of the under surface of the N substrate part in the light of easy processing of the N terminal. By the same token, the under surface of the P connecting wire receiving part may be at the same plane as that of the under surface of the P substrate part or a little above that of the under surface of the P substrate part. Preferably, however, it is at the same plane as that of the under surface of the P substrate part in the light of easy processing of the P terminal.

The parallel connecting diode with lead terminals of the present invention may be preferably used as a diode sealed in the solar cell module; however, there are other possible applications, i.e., it may be used also as a diode arranged in a terminal box for receiving output of the solar cell module and as a diode for other electric appliances.

In a preferred embodiment of the parallel connecting diode with lead terminals of the present invention, a thin part that is formed at the N bridge part may be available as an N connecting wire receiving part, and a thin part that is formed at the P bridge may be available as a P connecting wire receiving part.

Because in the parallel connecting diode with lead terminals, the thin parts are formed as a connecting wire receiving part at the N bridge part and the P bridge part, when the jumper cables are connected, said connecting parts have almost the same thickness as that of the main body of the parallel connecting diode with lead terminals. This, for example, permits the jumper cable connecting part to locally receive less deformation force on the diode with lead terminals attributable to torsion or deformation of the solar cell module and furthermore strengthens its tolerance to such deformation force. Consequently, the parallel connecting diode with lead terminals of the present invention is preferable as a CST bypass diode and a reverse current preventive diode that are subject to deformation force attributable to torsion or deformation of a solar cell module. Application of the parallel connecting diode with lead terminals is not limited to diodes sealed in the solar cell module, and said parallel connecting diode may be used for other purposes.

In another preferred embodiment of the parallel connecting diode with lead terminals of the present invention, a thin part that is formed extending from an N bridge part or an N substrate part may be available as an N connecting wire receiving part, and a thin part that is formed extending from a P bridge part or a P substrate part may be available as a P connecting wire receiving part.

Because the thin parts are formed as the connecting wire receiving part at the lead terminal, when jumper cables are connected, said connecting parts have almost the same thickness as that of the main body of the parallel connecting diode with lead terminals. This enables the jumper cable connecting part to locally receive less deformation force to the parallel connecting diode with lead terminals attributable to torsion or deformation of the solar cell module and furthermore strengthens tolerance to such deformation force. Consequently, the parallel connecting diode with lead terminals of the present invention is preferable as a CST bypass diode and a reverse current preventive diode that are subject to deformation force attributable to torsion or deformation of a solar cell module. Application of the parallel connecting diode with lead terminals is not limited to diodes sealed in the solar cell module, and said parallel diode may be used for other purposes.

This preferred embodiment provides great flexibility of arranging a position for the N connecting wire receiving part, thus enabling us to more freely arrange a location of the parallel connecting diode with lead terminals.

In another preferred embodiment of the parallel connecting diode with lead terminals of the present invention, said thin parts of the N terminal and/or the P terminal may be formed by means of etching. According to this preferred embodiment, the diode connecting parts (the N and P thin parts) and the connecting wire connecting parts (the N and P connecting wire receiving parts) are formed with no stress received. Therefore, the formation by means of etching is more effective in keeping the strength of the border area between the substrate part and the thin part of the diode with lead terminals than that by means of rolling. Furthermore, it is lower in production cost than the formation by means of die casting. However, in the parallel connecting diode with lead terminals of the present invention, said thin part may be formed by means of rolling or by means of die casting.

In another preferred embodiment of the diodes with terminals of the present invention, electric insulating members may be added to the side of said diode chip. According to this preferred embodiment, short circuit is prevented from being caused by dust between the side of the diode chip and the N terminal or the P terminal. In addition, long creepage distance may become long, thereby enhancing the electrical insulation between the N terminal and the P terminal. Furthermore, the diode chip may be protected from mechanical shock. In the case of using such diode chip that has the thin film made from glass formed at the connecting side of an N-type semiconductor and a P-type semiconductor, this preferred embodiment is particularly effective for protecting the glass made thin film.

Applying of this preferred embodiment to the diodes with lead terminals with a large electric capacity makes it more preferable. Electric insulating members may include molding members such as PPS and silicon rubber and coating materials (paints containing ceramic particles, viscous materials containing silicon, and the like are preferable).

In the solar cell module of another embodiment of the present invention, the parallel connecting diode with lead terminals of the present invention is used as a bypass diode that is connected in parallel to a cell string in which m solar cell cells (m is a positive integer of 2 or more) are connected in series via a conductor or as a reverse-current preventive diode that is connected in series to n said cell strings (n is a positive integer of 1 or more). Said parallel connecting diode with lead terminals of the present invention, together with the solar cells, is sealed between the upper surface material and the rear surface material where said solar cells are to be sealed.

The solar cell module of the present invention is less subject to failure caused by the heat generated in the diode. In most cases, said solar cell module has no need for terminal box for receiving its output, while in some cases, it needs only a small terminal box that is used only for connecting an external connecting cable. This permits the saving of the space where the solar cell module is mounted. The possibility of no necessity of terminal box, as described above, makes said solar cell module particularly preferable as a type of module transmitting part of sunlight (a certain area of the plane of the solar cell module acts as a solar cell and the other area transmits the outside light).

In general, the diode with lead terminals is arranged apart from the solar cell and connected to the cell string via the jumper cable. However, the diode with lead terminals and the solar cell may be arranged immediately so that the diode with lead terminals and the solar cell can be electrically connected using no jumper cable.

The terminal box for solar cells for receiving the output of the solar cell module of another embodiment of the present invention has the parallel connecting diode with lead terminals of the present invention arranged therein, said parallel connecting diode with lead terminals acting as a bypass diode that is connected in parallel to a cell string in which m solar cell cells (m is a positive integer of 2 or more) are connected in series via a conductor or as a reverse-current preventive diode that is connected in series to n said cell strings (n is a positive integer of 1 or more) in said solar cell module.

In general, the inside of the package of the terminal box for solar cells, to which terminal box the bypass diode and/or the reverse-current preventive diode are connected, are sealed with silicon resin, etc. This means that said diodes are surrounded with members with poor heat conductance, just like the case where diodes are sealed in the solar module. Therefore, the terminal box for solar cell for which the diodes with lead terminals of the present invention for heat release are used, has less problems arising out of heat generated in the diodes. The plate-like shape of the diode with lead terminals of the present invention enables the package of the terminal box for solar cell to become thin, allowing the saving of resin sealing materials and of materials for the package.

The present invention, the preferred embodiments of the present invention, and the elements included therein described above may be embodied in other specific forms when they are combined to as much extent as possible.

EFFECTIVENESS OF THE INVENTION

A series of embodiments of the present invention are a diode with lead terminals for solar cell, a solar cell module for which the diode is used, and a terminal box for solar cells. According to the present invention, there is obtained a diode with lead terminals that acts as a CST bypass diode and/or a reverse-current preventive diode for the solar cell module, wherein local temperature of the diode chip is restrained from increasing, and tolerance to torsion and deformation of the members sandwiched from above and below is improved.

According to the present invention, there is obtained a solar cell module in which a CST bypass diode and/or a reverse-current preventive diode are integrally sealed, wherein problems, including contact failure of a diode chip and a lead terminal, malfunction of a diode chip, and discoloration of sealing members, arising out of heat generated in the diodes are inhibited. According to the present invention, there is obtained a terminal box for the solar cell module, wherein problems, including contact failure of a diode chip and a lead terminal and malfunction of a diode chip, arising out of heat generated in the diodes are inhibited.

A series of other embodiments of the present invention are a parallel connecting diode with lead terminals, solar cell modules for which the diode is used, and a terminal box for solar cells. According to the present invention, there is obtained a parallel connecting diode with lead terminals, wherein local temperature of the diode is restrained from increasing and implementation work is easily performed. Said parallel connecting diode with lead terminals is useful as a diode with lead terminals for solar cells and is useful also for other purposes.

According to the present invention, there is obtained a solar cell module in which a CST bypass diode and/or a reverse-current preventive diode are integrally sealed, wherein problems, including contact failure of a diode chip and a lead terminal, malfunction of a diode chip, and discoloration of sealing members, arising out of heat generated in the diodes are inhibited. According to the present invention, there is obtained a terminal box for the solar cell module, wherein problems, including contact failure of a diode chip and a lead terminal and malfunction of a diode chip, arising out of heat generated in the diodes are inhibited.

DESCRIPTION OF REFERENCE NUMERALS

Figure 1:
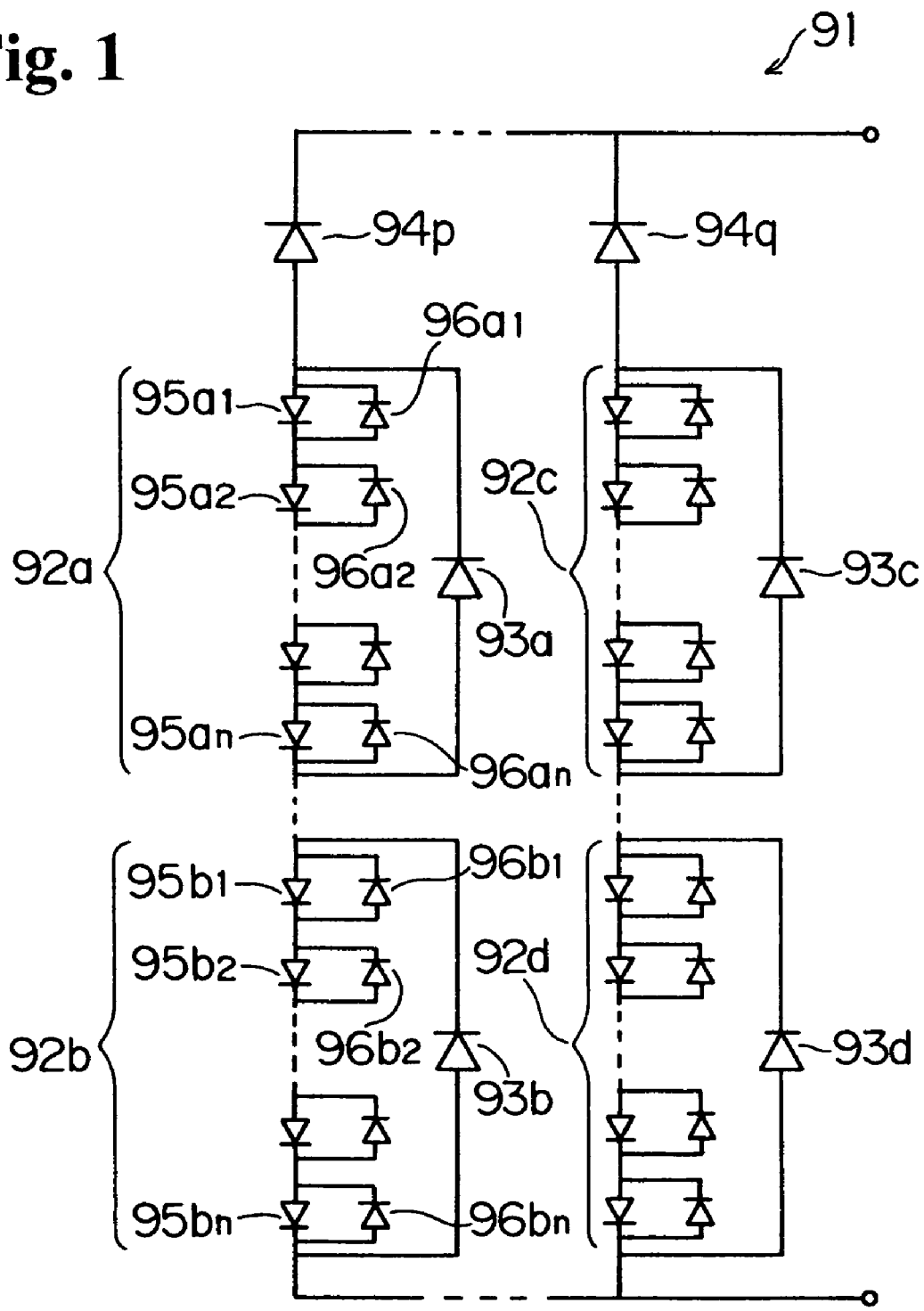
FIG. 1 is an illustration of the circuit of a solar cell array.

1 and 4 Diode with lead terminals
2, 3, and 5 Parallel connecting diode with lead terminals
6 and 7 CST bypass diode (bypass diode for cell string)
8 Reverse-current preventive diode
11 N terminal
12 N substrate part
13 N thin part
14 N connecting wire receiving part
21 P terminal
22 P substrate part
23 P thin part
24 P connecting wire receiving part
31 Diode chip
61 Solar cell module
66, 67, 68, 69, and 70 Jumper cable
75 Terminal box
76, 77, and 78 Terminal plate
79 Window
82 Package
91 Solar cell array
92a, 92b, 92c, and 92d Cell string
93a, 93b, 93c, and 93d CST bypass diode
94p and 94q Reverse-current preventive diode
111 N terminal
112a and 112b N substrate part
113a and 113b N thin part
114 N connecting wire receiving part
115 N bridge part
121 P terminal
122a and 122b P substrate part
123a and 123b P thin part
124 P connecting wire receiving part
125 P bridge part
131a and 131b Diode chip
312 N substrate part
322 P substrate part
323 P thin part
511 N terminal
512a and 512b N substrate part
513a and 513b N thin part
514 N connecting wire receiving part
515 N bridge part
521 P terminal
522a and 522b P substrate part
523a and 523b P thin part
524 P connecting wire receiving part
525 P bridge part
X Right and left direction
Y Forward and backward direction

MOST PREFERRED EMBODIMENT TO CARRY OUT THE INVENTION

In the present invention, the flat plate-shaped diode chip means a diode chip having a thickness of approximately 0.10 mm to 0.40 mm.

Concerning the electric standard values of the diode chip used for the diode with lead terminals that acts as a CST bypass diode or reverse-current preventive diode, the lower limit of $I_o$ is usually 5 A (ampere) or more, preferably 8 A or more, more preferably 10 A or more. The upper limit of $I_o$ is not limited, but usually 50 A or less from the viewpoint of cost and the like. Because in general solar cells generate low voltage, any diode chip that meets the above $I_o$ value meets $V_{RM}$ value also. The lower limit of $V_{RM}$ value of such diode chip is, for example, 600 V (voltage) or more, and the upper limit is, for example, 2000 V or less.

In the case that a flat plate-shaped, pn junction diode chip is manufactured at a thickness of approximately 0.10 to 0.40 mm, a diode chip that meets the standard values described above has a square of 2.5 mm or more on a side, preferably from 2.7 mm or more to 8.0 mm or less, more preferably from 3.5 mm or more to 8.0 mm or less, still more preferably from 3.5 mm or more to 6.0 mm or less, and most preferably from 4.0 mm or more to 6.0 mm or less, or a plane shape with the same dimensions. Diode chips that meet the requirements mentioned above may generally be available for recently advanced solar cell modules with large amount of output.

For a plurality of diode chips used for the parallel connecting diodes with lead terminals or for the diodes with lead terminals for which a plurality of diodes with lead terminals are used at one connecting part, the total of the electric standard values of each of said diode chips just have to be within the range of the electric standard value for a single diode chip as described above. However, in consideration of the case where electric current is not evenly divided into the diode chips connected in parallel, it is recommended that a calculated value be multiplied by 1.2 to 1.5 to leave a safety margin. In the case that a flat plate-shaped, pn junction diode chip is manufactured at a thickness of approximately 0.10 mm to 0.40 mm, a diode chip that meets the electric standard values described above has a square of 2.0 mm or more on a side, preferably from 2.7 mm or more to 6.0 mm or less, more preferably from 3.0 mm or more to 6.0 mm or less, or a plane shape with the same dimensions.

There is no specific restriction on the electric standard values of the diode chips used for the parallel connecting diodes with lead terminals that are available for other purposes. In other words, the electric standard values may be either more or less than the electric standard values mentioned above. Therefore, in the case that a flat plate-shaped, pn junction diode chip is manufactured at a thickness of approximately 0.10 to 0.40 mm, the size of the diode chips may be either larger or smaller than the measurements mentioned above.

The N terminal and the P terminal of the diode with lead terminals and the parallel connecting diode with lead terminals of the present invention are made from conductive materials. The conductive materials may be copper and brass, preferably copper. In the diode with lead terminals of the present invention, the wording of almost square shape, which is referred to as the shape of the terminal, includes the following shapes: a rectangle where the thin part, the substrate part, and the connecting wire receiving part have the same width in the forward and backward directions, and a rectangle where the thin part and the substrate part are rectangular and a connecting wire receiving part with a random shape and dimension is added to the rectangular shape. The thin part may be different in width in the forward and backward directions from the substrate part.

In the diode with lead terminals that is sealed in the solar cell module and the parallel connecting diode with lead terminals that is used as a CST bypass diode or reverse-current preventive diode sealed in the solar cell module, the thickness of the N substrate part (and the P substrate part) is usually 0.8 mm or more, preferably 0.9 mm or more, more preferably 1.0 mm or more. The upper limit of the thickness, which depends on the distance between the front surface and the rear surface of the solar cell module, is usually 2.0 mm, preferably 1.5 mm, more preferably 1.2 mm. The lead terminal whose thickness is within the range described above has enough cross section, allowing the heat generated in the diode chip to be transmitted therethrough and then released effectively. Furthermore, the diode chip can be sealed with no difficulty.

In the diode with lead terminals that is arranged in the terminal box for the solar cell and the parallel connecting diode with lead terminals that is arranged in terminal box for the solar cell, the thickness of the N substrate part (and the P substrate part) is usually 0.8 mm or more, preferably 0.9 mm or more, more preferably 1.0 mm or more. There is no specific restriction on the upper limit of the thickness, but the upper limit is usually 5.0 mm, preferably 2.0 mm. The lead terminal whose thickness is within the range described above has enough cross section, allowing the heat generated in the diode chip to be transmitted therethrough and then released effectively.

Concerning the parallel connecting diode with lead terminals for other applications, there is no specific restriction on the thickness of the N substrate part thereof; however, it is preferable that the thickness is from 0.5 mm or more to 5 mm or less from the viewpoint of practicality.

The total of the plane area of the N substrate part and that of the P substrate part of the diode with lead terminals is usually 200 mm$^2$ or more, preferably 300 mm$^2$ or more, more preferably 360 mm$^2$ or more. If the total plane area is within the range described above, the release of the heat generated in the diode chip proceeds, and the temperature of the diode chip sealed in the solar cell module stays within the allowable range. If the total plane area is within the range described above, for example, when the width of one substrate part is 5 mm, the length of said substrate part is approximately 20 mm, allowing the heat generated when the jumper cable is soldered on the connecting wire receiving part to be released. Therefore, no solder for connecting the diode that had been connected to the thin part in advance is adversely affected by said heat.

There is no specific restriction on the upper limit of said plane area, but the upper limit is usually 1200 mm$^2$ or less, preferably 600 mm$^2$ or less. The ratio of the plane area of the N substrate part to that of the P substrate part is usually 8:2 to 2:8, preferably 7:3 to 3:7, more preferably 6:4 to 4:6.

In the case that the parallel connecting diode with lead terminals that is sealed in the solar cell module, the thickness of the N substrate part (and the P substrate part) and the total of the plane area of the N substrate part and that of the P substrate part are both equal to the thickness and the total plane area of the diode with lead terminals mentioned above, respectively, and the recommended range is also the same as that of the diode with lead terminals mentioned above. In this case, the plane area of a pair of the N substrate part and that of the P substrate part are diverted to the plane area of the N substrate part and that of the P substrate part. The area of the N substrate part is obtained by dividing the area of the N bridge part by the quantity of the N substrate part and then adding the solution to the area of the N substrate part. The same applies to the calculation for the area of the P substrate part. The ratio of the plane area of the N substrate part (one of the pair) to that of the P substrate (the other of the pair) is equal to that of the diode with lead terminals described above, and the preferable range is also the same.

In the case that the parallel connecting diode with lead terminals is used for other purposes, the thickness of the N substrate part (and the P substrate part) and the total of the plane area of the N substrate part and that of the P substrate are may be decided appropriately, depending on the size of the diode chip, usage environment, and the like. Furthermore, the ratio of the plane area of the N substrate part to that of the P substrate part also may be decided appropriately. However, when such parallel connecting diode with lead terminals for other purposes is designed, the numerical values, including thickness and plane area, that are applied to the design of the parallel connecting diode with lead terminals sealed in the solar cell module may be available as reference.

The solar cell module is formed so that the solar cells, etc. are sandwiched between the front surface material and the rear surface material, where the space is then filled with sealing resin. Therefore, the diode with lead terminals of the present invention or the parallel connecting diode with lead terminals of the present invention used as a CST bypass diode or a reverse-current preventive diode sealed in the solar cell module is sandwiched between the front surface material and the rear surface material. EVA (ethylene-vinyl acetate), PVB (polyvinyl butyl), silicone resin and the like are used as sealing resin.

EXAMPLE 1

The diode with lead terminals, the parallel connecting diode with lead terminals, the solar cell module, and the terminal box for solar cell of the present invention will be explained in detail by the following embodiment. Measurements, materials, shapes, relative positions, etc. of the members and parts described in the embodiments of the present invention are merely examples and are not intended to restrict the scope of the present invention thereto, except as specifically described.

Figure 2A:
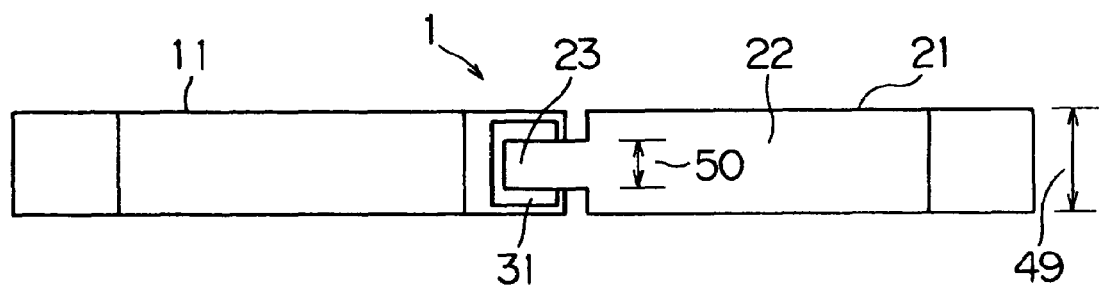
FIG. 2 is an illustration of a diode with lead terminals.
Figure 2B:
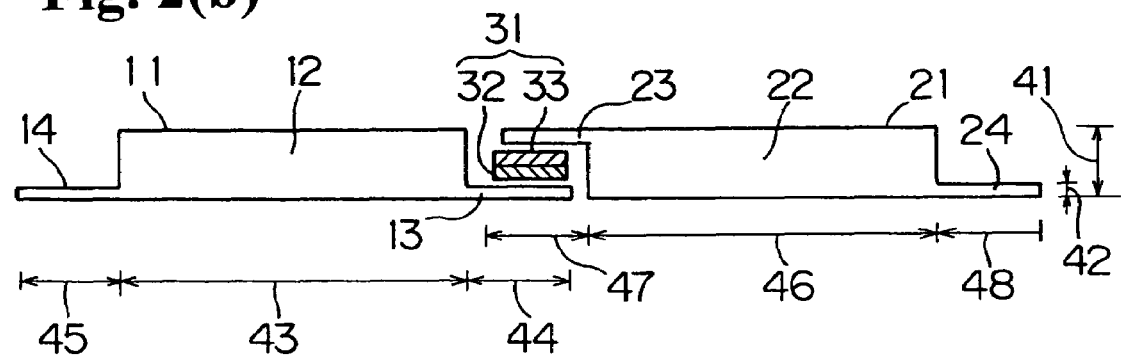

FIG. 2 is an illustration of a diode with lead terminals of the present invention. In the figure, (a) is a plane view, and (b) is a cross-sectional view. A diode with lead terminals 1 comprises an N terminal 11, a P terminal 21, and a diode tip 31. The N terminal 11, which is a rectangular copper plate, has a thin part formed by means of etching at each end thereof and is nickel-plated (tin-plating is acceptable) on the entire surface thereof. The N terminal 11 comprises an N substrate part 12, an N thin part 13, and an N connecting wire receiving part 14. The N substrate part 12, the N thin part 13, and the N connecting wire receiving part 14 are in plane on the under surface.

The P terminal 21, which is an almost rectangular copper plate, has a thin part formed by means of etching at each end thereof and is nickel-plated (tin-plating is acceptable) on the entire surface thereof. The P terminal 21 comprises a P substrate part 22, a P thin part 23, and a P connecting wire receiving part 24. The P substrate part 22 and the P thin part 23 are in plane on the upper surface. The P substrate part 22 and the P connecting wire receiving part 24 are in plane on the under surface. As shown in plane view (a), the P thin part 23 is formed narrower than the P substrate part 24.

The diode chip 31 is in the form of a plane square plate and has an N-type semiconductor 32 and a P-type semiconductor 33 joined thereto. The under surface of the N-type semiconductor 32 is connected to the N thin part 13, and the upper surface of the P-type semiconductor 33 is connected to the under surface of the P thin part 23 so that the diode chip 31 can be connected to the N terminal 11 and the P terminal 21. The diode chip and the terminal are connected to each other by a known connecting method. Such method includes soldering by using solder paste and a heating furnace, soldering by using a solder iron, and adhesion by using conductive adhesive agents. Among them, soldering by using solder paste and a heating furnace is preferable.

The overlapped portion of the N thin part 13, the diode chip 31, and the P thin part 23 has the same thickness as that of the N substrate part 12. The P substrate part 22 has the same thickness as that of the N substrate part 12. Jumper cables in ribbon shape or other shapes are connected to the N connecting wire receiving part 14 and the P connecting wire receiving part 24 by means of soldering or other methods. The thickness of the N connecting wire receiving part 14 and the P connecting wire receiving part 24 is determined that the total thickness of the part and such jumper cable is the same as or less than the thickness of the N substrate part to avoid transformation force caused by torsion or deformation under the circumstances where such jumper cable is connected.

Electric insulating members may be added to the side of the diode chip 31 of the diode with lead terminals. The addition can prevent the short circuit caused by dust and can make creepage distance longer, thereby enhancing electric insulation of the N terminal 11 and the P terminal 21. It also can protect the diode chip 31 against mechanical shock. The electric insulating members include molding members made from PPS and silicon. Coating materials (preferably, paints containing ceramic particles, and silicon sealing materials) are also acceptable.

Red, blue, yellow or green heat-resistant paint, where necessary, may be applied to the upper surface and/or the under surface of the diode with lead terminals 1 that are connected to the diode chip 31, except the upper surface of the N connecting wire receiving part 14 and the upper surface of the P connecting wire receiving part. Any other colors are acceptable.

The size of each part of the diode with lead terminals 1 is as follows (figures: mm in unit; and figures in parenthesis: reference numerals arrowed):

The thickness of the N substrate part 12 (41): 1
The thickness of the N thin part 13, the N connecting wire receiving part 14, and the P connecting wire receiving part 24 (42): 0.25
The thickness of the P thin part 23: 0.25
The width of the N substrate part 12 (49): 6
The length of the N substrate part 12 (43): 29
The length of the N thin part 13 (44) and the length of the N connecting wire receiving part (45): 6.5
The length of the P substrate part 22 (46): 27
The length of the P thin part 23 (47): 6.5
The length of the P connecting wire receiving part (48): 6.5
The width of the P thin part 23 (50): 3
The total of the plane area of the N substrate part and that of the P substrate part was 336 mm$^2$.

Figure 3:
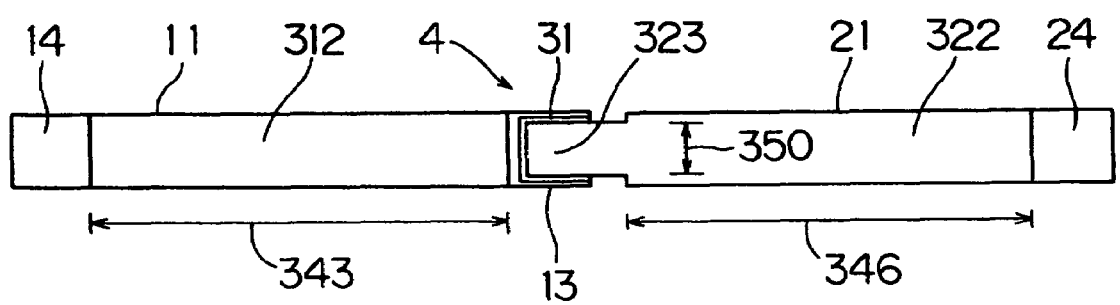
FIG. 3 is an illustration of a diode with lead terminals of another embodiment.

FIG. 3 is an illustration of a diode with lead terminals of another embodiment. The width of the P thin part 323, the length of the N substrate part 312, and the length of the P substrate part 322 of the diode with lead terminals 4, etc. are different from the counterparts of the diode with lead terminals 1 shown in FIG. 2. Among parts and portions of the diode with lead terminals 4, the same parts and portions that the diode with lead terminals 1 has are given the same number as that of the counterparts of the diode with lead terminals 1. The following description deals with the diode with lead terminals 4, focusing on differences from the diode with lead terminals 1.

The diode with lead terminals 4 comprises an N terminal 11, a P terminal 21, and a diode chip 31. The N terminal 11 comprises an N substrate part 312, an N thin part 13, and an N connecting wire receiving part 14. The P terminal 21 comprises a P substrate part 322, a P thin part 323, and a P connecting wire receiving part 24.

The width of the P thin part 223 (indicated by arrow 350 in the figure) is 5 mm. The diode chip 31 is almost covered by the N thin part 13 and the P thin part 323. This protects the diode chip 31 against unexpected mechanical shock, which otherwise damages it. The diode chip 31 used for the diode with lead terminals 4 shown in FIG. 3 is 5.5 mm×5.5 mm in size, with part of the outer part of the diode chip 31 being exposed from the P thin part 323. However, use of a diode chip 31 of a smaller size, for example, 4.6 mm×4.6 mm, allows it to be completely covered by the N thin part 13 and the P thin part 323, which situation enables the diode chip 31 to be effectively protected against damages. Increased width of the P thin part 323 (indicated by arrow 350) allows the heat generated in the diode chip 31 to be more effectively transferred through the P thin part 323 to the P substrate part 322 and then to be released outside, which situation increases the heat release of the diode with lead terminals 4.

The length of the N substrate part 312 (the length of arrow 343) is 34 mm, and the length of the P substrate part 322 (the length of arrow 346) is 34 mm. The width and thickness of the N substrate part 312 and the P substrate part 322 are equal to the counterparts of the diode with lead terminals 1. Therefore, the total of the plane area of the N substrate part and that of the P substrate part is 408 mm².

Figure 4A:
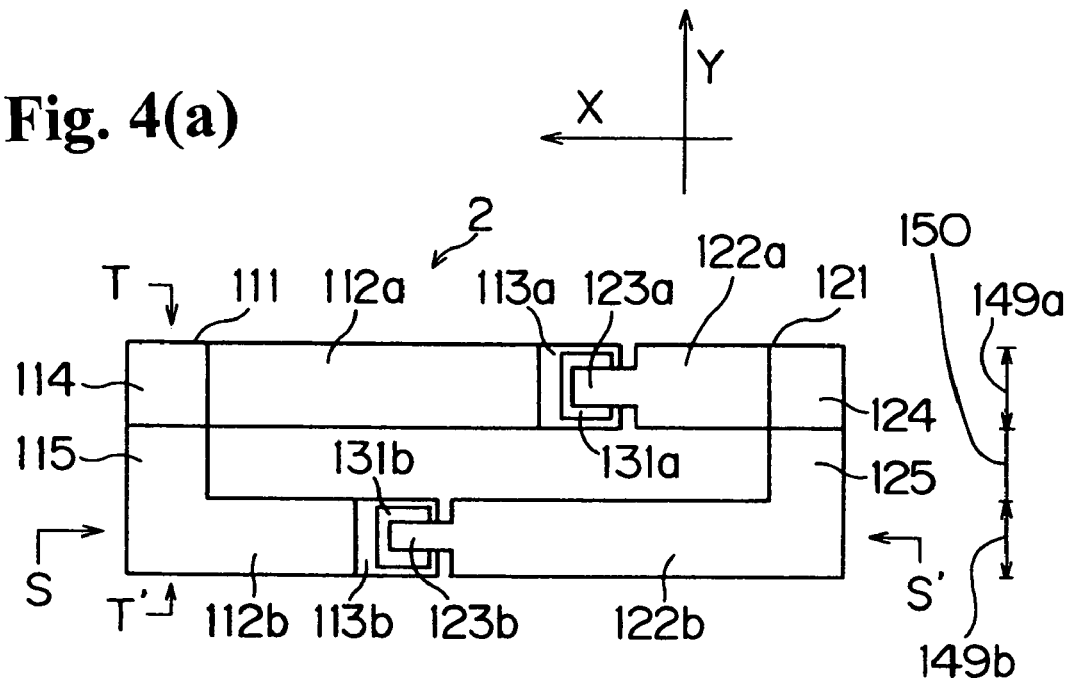
FIG. 4 is an illustration of a parallel connecting diode with lead terminals.
Figure 4B:
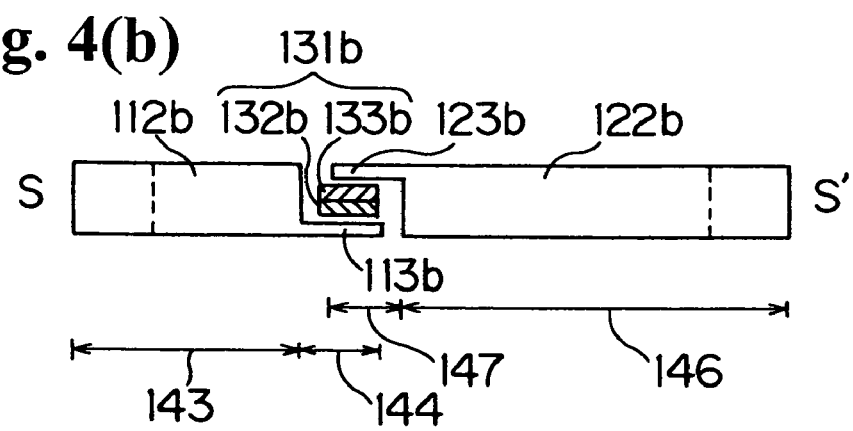
Figure 4C:
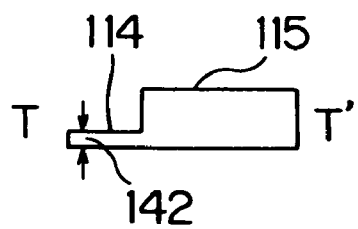

FIG. 4 is an illustration of a parallel connecting diode with lead terminals. In the figure, (a) is a plane view, (b) is a cross-sectional view taken along lines S-S', and (c) is a cross-sectional view taken along lines T-T'. The parallel connecting diode with lead terminals 2 comprises an N terminal 111, a P terminal 121, a diode chip 131a, and a diode chip 131b. In the figure, X shows the right and left direction, and Y shows the forward and backward directions.

The N terminal 111 comprises an N bridge part 115 extending in the forward and backward directions, an N substrate part 112a extending in the right direction from the N bridge part 115, and an N substrate part 112b extending in the right direction from the N bridge part 115. Thin parts 113a and 113b are formed at the ends of the N substrate parts 112a and 112b, respectively. The N bridge part 115, the N substrate parts 112a and 112b, and the thin parts 113a and 113b are in plane on the under surface.

The P terminal 121 comprises a P bridge part 125 extending in the forward and backward directions, a P substrate part 122a extending in the left direction from the P bridge part 125, and a P substrate part 122b extending in the left direction from the P bridge part 125. Thin parts 123a and 123b are formed at the ends of the P substrate parts 122a and 122b, respectively. The P bridge part 125, the P substrate parts 122a and 122b, and the thin parts 123a and 123b are in plane on the upper surface. The P bridge part 125 and the P substrate parts 122a and 122b are in plane on the under surface. Like the diode chip 31 described above, two diode chips 131a and 131b are in the form of plane square plate, where a P-type semiconductor and an N-type semiconductor are connected.

The cross-sectional view (b) shows that at the end of the N substrate part 112b, the under surface of the N-type semiconductor 132b of the diode chip 131b is connected to the thin part 113b, and at the end of the P substrate part 122b, the upper surface of the P-type semiconductor 133b is connected to the under surface of the P thin part 123b. At the ends of the N substrate part 112a and the P substrate part 122a, the diode chip 131a is connected likewise. In this way, the two diode chips 131a and 131b are connected to each other in parallel between the N terminal 111 and the P terminal 121.

The overlapped portion of the N thin part 113a, the diode chip 131a, and the P thin part 123a has the same thickness as that of the N substrate part 112a. The P substrate part 122a has the same thickness as that of the N substrate part 112a. Likewise, the overlapped portion of the N thin part 113b, the diode chip 131b, and the P thin part 123b has the same thickness as that of the N substrate part 112b. The P substrate part 122b has the same thickness as that of the N substrate part 112b. Furthermore, the N bridge part 115 and P bridge part 125 have the same thickness as that of the N substrate parts 112a and 112b, respectively.

As shown in (C), part of the N bridge part 115 is thinned to form the N connecting wire receiving part 114, and likewise, part of the P bridge part 125 is thinned to form the P connecting wire receiving part 124.

The size of each part of the diode with lead terminals 2 is as follows (figures: mm in unit and figures in parenthesis: reference numerals arrowed):

The thickness of the N substrate part 112a and the thickness of the N substrate part 112b: 1

The thickness of the P substrate part 122a and the thickness of the P substrate part 122b: 1

The thickness of the N thin parts 113a and 113b, the thickness of the N connecting wire receiving part 114 (142), and the thickness of the P connecting wire receiving part 124: 0.25

The thickness of the P thin part 123a and the thickness of the P thin part 123b: 0.25

The width of the N substrate part 112a (149a) and the width of the N substrate part 112b (149b): 6

The length of the N substrate part 112b including the N bridge part 115 (143): 17.4

The length of the N thin part 113b (144): 6

The length of the P substrate part 122b including the P bridge part 125 (146): 30

The length of the P thin part 123b (147): 6

The width of the P thin part 123b: 3

The distance between the N substrate part 112a and the N substrate part 112b (150): 5.4

The length in the right and left direction of the N bridge part 115 and the length in the right and left direction of P bridge part 125: 6

For a single diode chip, the total of the plane area of the N substrate part (including half of the plane area of the N bridge part) and that of the P substrate part (including half of the plane area of the P bridge part) was 281 mm². In this case, the areas of the N connecting wire receiving part 114 and the P connecting wire receiving 124 are excluded.

Figure 5:
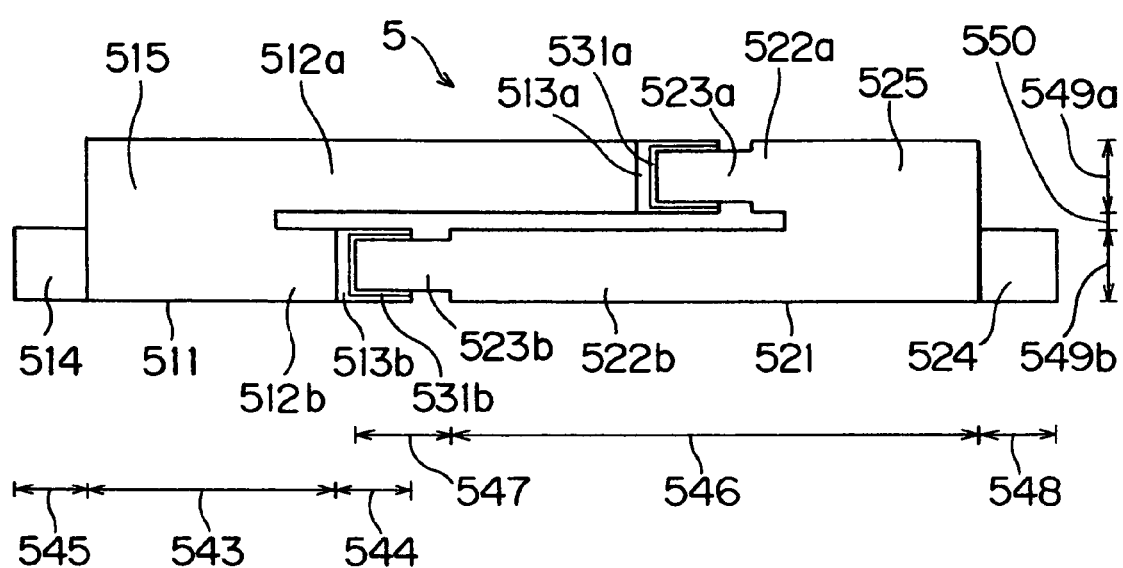
FIG. 5 is an illustration of a parallel connecting diode with lead terminals of another embodiment.

FIG. 5 is an illustration of a parallel connecting diode with lead terminals of another embodiment. The width of a P thin parts 523a and 523b, the distance between the N substrate part 512a and the N substrate part 513b, the mounting location of the N connecting wire receiving part 514 and the like of the parallel connecting diode with lead terminals 5 are different from the counterparts of the parallel connecting diode with lead terminals 2 shown in FIG. 4. The following description deals with the diode with lead terminals 5, focusing on differences from the diode with lead terminals 2.

The N terminal 511 comprises an N bridge part 515 extending in the forward and backward directions, an N substrate part 512a extending in the right direction from the N bridge part 515, and an N substrate part 512b extending in the right direction from the N bridge part 515. Thin parts 513a and 513b are formed at the ends of the N substrate parts 512a and 512b, respectively.

The P terminal 521 comprises a P bridge part 525 extending in the forward and backward directions, a P substrate part 522a extending in the left direction from the P bridge part 525, and a P substrate part 522b extending in the left direction from the P bridge part 525. Thin parts 523a and 523b are formed at the ends of the P substrate parts 522a and 522b, respectively.

Like the diode chip 31 described above, two diode chips 531a and 531b are in the form of plane square plate, where a P-type semiconductor and an N-type semiconductor are connected. The front side of the N bridge part 515 is extended to the left to form an N connecting wire receiving part 514. The front side of the P bridge part 525 is extended to the right to form a P connecting wire receiving part 524.

As described above, the N connecting wire receiving parts of the parallel connecting diode with lead terminals may be arranged by forming a thin part at the N bridge part and or may be arranged by forming another thin part at the N bridge part or the N substrate part. Likewise, the P connecting wire receiving parts may be arranged by forming a thin part at the P bridge part or may be arranged by forming another thin part at the P bridge part or the P substrate part.

The size of each part of the parallel connecting diode with lead terminals 5 is as follows (figures: mm in unit; and numbers in parenthesis: arrowed numerals):
The thickness of the N substrate part 512a and the thickness of the N substrate part 512b: 1
The thickness of the P substrate part 522a and the thickness of the P substrate part 522b: 1
The width of the N substrate part 512a (549a) and the width of the N substrate part 512b (549b): 6
The width of the P substrate part 522a (549a) and the width of the P substrate part 522b (549b): 6
The length of the N substrate part 512b including the N bridge part 515 (543): 22
The length of the P substrate part 522b including the P bridge part 525 (546): 45
The distance between the N substrate part 512a and the N substrate part 512b (550): 2
The length in the right and left direction of the N bridge part 515 and the length in the right and left direction of the P bridge part 525: 16
The width of the P thin part 523a and the width of the P thin part 523b: 4.8
For a single diode chip, the total of the plane area of the N substrate part (including half of the plane area of the N bridge part) and that of the P substrate part (including half of the plane area of the P bridge part) was 434 mm$^2$.

Figure 6:
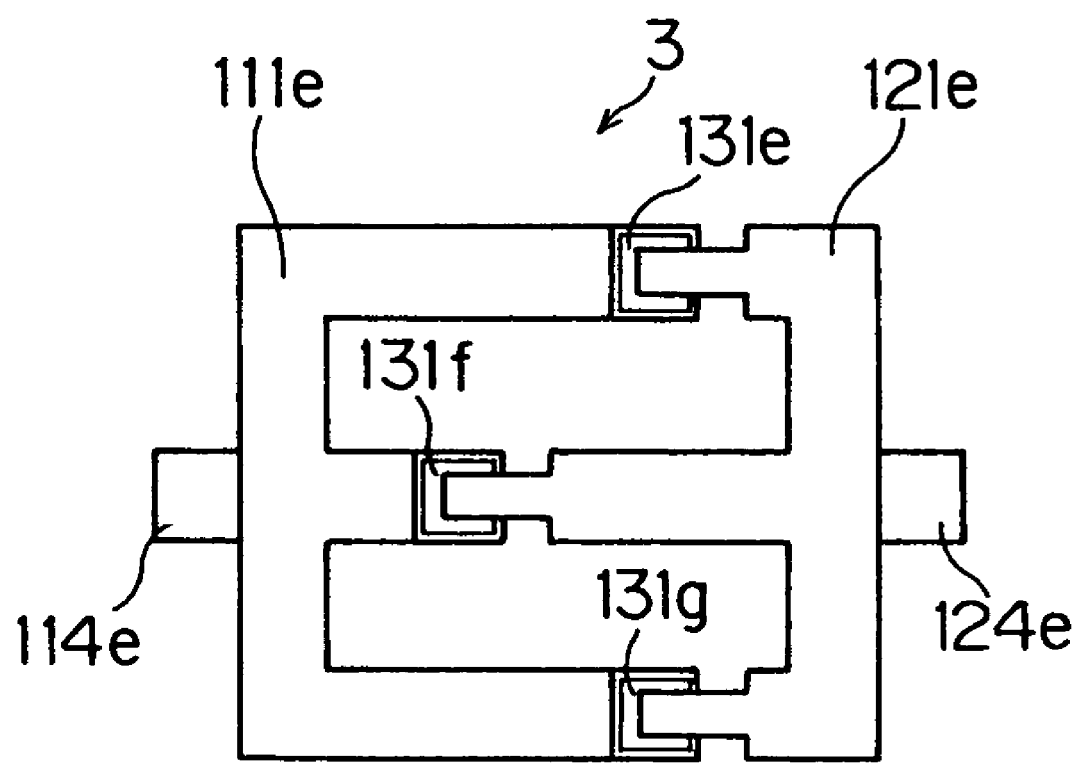
FIG. 6 is an illustration of a parallel connecting diode with lead terminals of still another embodiment.

FIG. 6 is a plane illustration of a parallel connecting diode with lead terminals of another embodiment. In the parallel connecting diode with lead terminals 3, an N terminal 111e and a P terminal 121e each have three substrate parts, where three diode tips 131e, 131f, and 131g are connected in parallel.

In the parallel connecting diode with lead terminals, it is preferable that a plurality of diode chips are located as far as possible from each other in order to spread out heat generation sources. Therefore, like the parallel connecting diode with lead terminals 3, it is preferable that diode chips are located alternately (in a zigzag) near the N bridge part and the P bridge part.

The thickness of the connecting wire receiving part and the thickness of the thin part of the parallel connecting diode with lead terminals 3 are the same as described in the parallel connecting diode with lead terminals 1.

For the diode with lead terminals 4 and the parallel connecting diodes with lead terminals 2, 3, and 5 described above, the materials of their lead terminals, the method for processing their thin parts, and the method for connecting their thin part and diode chip are the same as described in the diode with lead terminals 1. Also for these diodes may electric insulating members be added to the side of the diode chip, as described in the explanation as to the diode with lead terminals 1. Furthermore, these may be colored as described in the explanation as to the diode with lead terminals 1.

Figure 7:
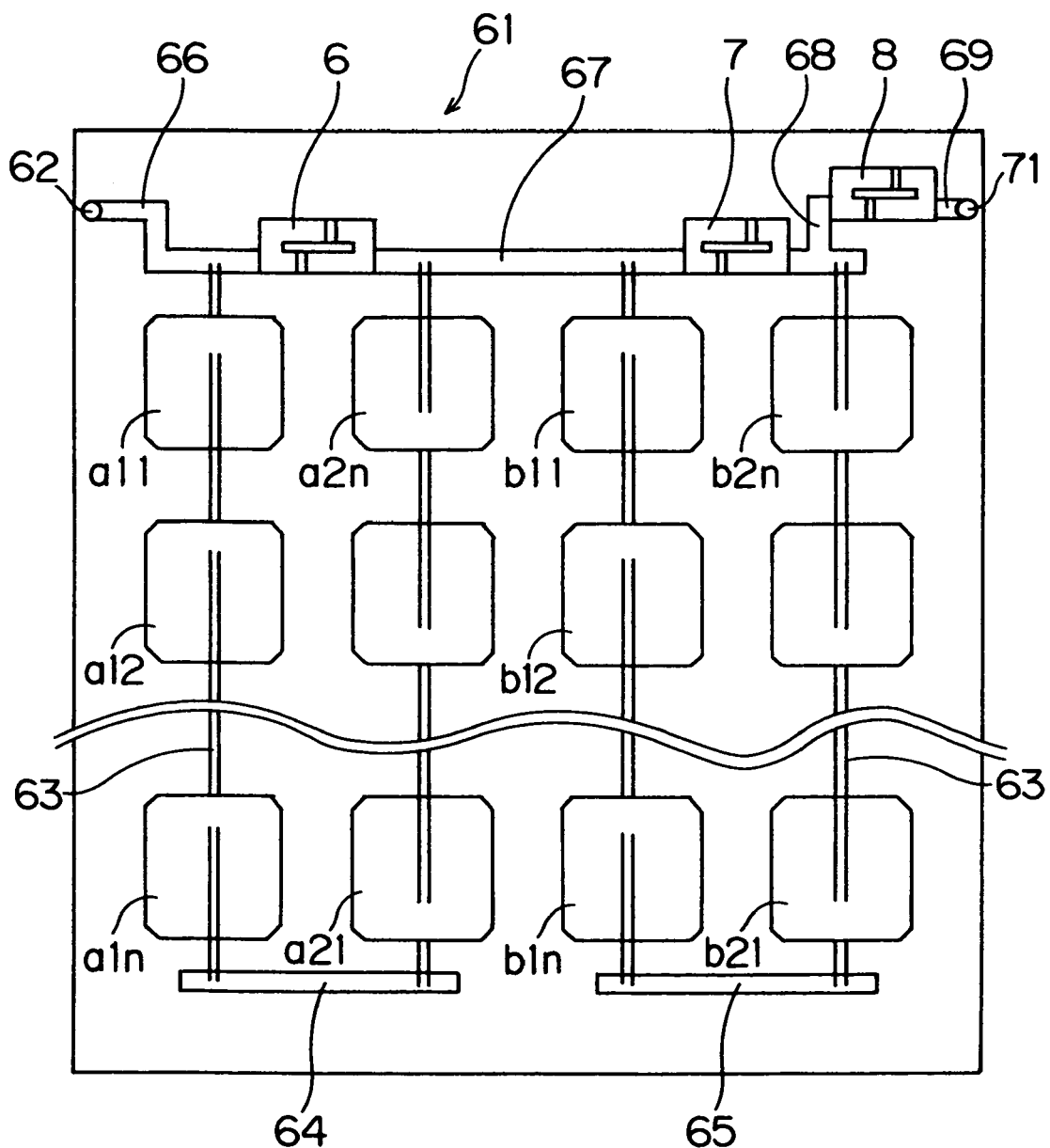
FIG. 7 is an illustration of a solar cell module.

FIG. 7 is an illustration of a solar cell module. A solar cell module 61 contains two lines of cell strings that are connected to each other in series, and contains also two CST bypass diodes 6 and 7 that each are connected to the cell string in parallel and a reverse-current preventive diode 8 that is connected to the two lines of cell strings in series.

One line of cell strings comprises 2n cells; the cells from a cell a11 to a1n being connected through a ribbon cable 63 and then connected to a jumper cable 64 and the cells from a cell a21 to a2n being connected through the ribbon cable 63. Likewise, another line of cell strings also comprises 2n cells; the cells from a cell b11 to b2n being connected through the ribbon cable 63 and a jumper cable 65.

The CST bypass diodes 6 and 7 that are connected to the cell string in parallel are the parallel connecting diode with lead terminals 5 (for which two diode chips of 5.5 mm×5.5 mm are used) described above. The reverse-current preventive diode 8 is also the parallel connecting diode with lead terminals 5 (for which two diode chips of 5.5 mm×5.5 mm are used) described above.

Jumper cables 66, 67, 68, and 69 each are a ribbon-shaped copper cable of 6 mm in width and 0.5 mm in thickness. Module connecting cables, which are not shown in the figure, are connected to the module connecting ends 62 and 71. The solar cell module 61, whose upper and under surfaces are glass plates, has cells axy and bxy, the CST bypass diodes 6 and 7, the reverse-current preventive diode 8, the jumper cables 64 to 69 and the like sandwiched therein, and EVA resin is sealed in the empty space. The distance between the two glass plates is 3 mm. The solar cell module 61 is surrounded on four sides by an aluminum frame, which is not shown in the figure.

The CST bypass diodes 6 and 7 and the reverse-current preventive diode 8 may be replaced, for example, by a diode with lead terminal 1 or a diode with lead terminal 4 described above. Furthermore, the CST bypass diodes 6 and 7 and the reverse-current preventive diode 8 may be replaced, for example, by two or more diodes with lead terminal 1 (described above) connected in parallel or by two or more diodes with lead terminal 4 connected in parallel. Still furthermore, the CST bypass diodes 6 and 7 and/or the reverse-current preventive diode 8 may be arranged within a separate terminal box from the solar cell module 61.

Figure 8:
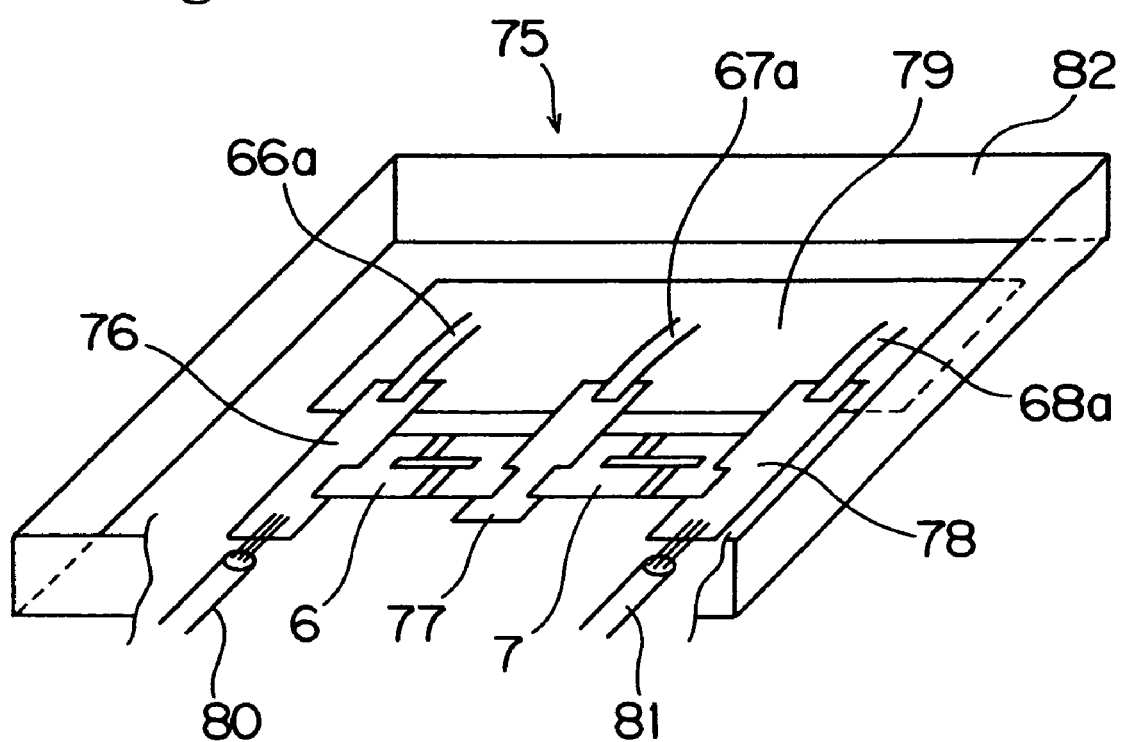
FIG. 8 is an illustration of a terminal box.

FIG. 8 is an illustration of a terminal box. A terminal box 75 has a terminal plate 76, a terminal plate 77, and a terminal plate 78 in the package 82 thereof. A CST bypass diode 6 is arranged between a terminal plate 76 and a terminal plate 77. A CST bypass diode 7 is arranged between a terminal plate 77 and a terminal plate 78. The CST bypass diodes 6 and 7 are the parallel connecting diode with lead terminals 5 (for which two diode chips of 4.8 mm×4.8 mm are used) described above. Engaging of an N connecting wire receiving part 514 and a P connecting wire receiving part 524 of the parallel diode with lead terminals each to the terminal plates enables the fixing of the location, thereby making soldering and other works easy.

The CST bypass diodes 6 and 7 may be replaced, for example, by a diode with lead terminal 1 or a diode with lead terminal 4 described above. Furthermore, the CST bypass diodes 6 and 7 may be replaced, for example, by two or more diodes with lead terminal 1 (described above) connected in parallel or by two or more diodes with lead terminal 4 (described above) connected in parallel. As in the case of the parallel connecting diode with lead terminals, engaging of an N connecting wire receiving part 14 and a P connecting wire receiving part 24 of the diode with lead terminals each to the terminal plates enables the fixing of the location, thereby making soldering and other works easy.

The terminal box 75 is mounted on the rear side of the solar cell module. A window 79 is a space set up on the bottom face of the case 82. Ribbon-shaped cables 66a, 67a, and 68a each being pulled out of the rear side or the side of the solar cell module, are put into the terminal box 75 through the window 79 to be connected to the terminal plates 76, 77, and 78 by means of soldering.

As explained referring to FIG. 7, the solar cell module to which the terminal box 75 is connected, has two lines of cell strings. The ribbon-shaped copper cable 66a is connected to the start point of the first cell string. The ribbon-shaped copper cable 67a is connected to the end point of the first cell string and the start point of the second cell string. The ribbon-shaped copper cable 68a is connected to the end point of the second cell string.

The terminal plate 76 is connected to the connecting cable 80, and the terminal plate 78 is connected to the connecting cable 81. The connecting cables 80 and 81 receive output from the solar cell module. After the ribbon-shaped copper cables 66a, 67a, and 68a are connected, silicon resin and the like are encapsulated into the terminal box 75, which is then covered with a lid (not shown in the figure) and fixed on the solar cell module.

Use of the diode with lead terminals and/or parallel connecting diode with lead terminals of the present invention enables the heat generated in the diode chip to be released and permits the lowering of the height of the package 82, thereby contributing to the saving of silicon resin and materials for package.

[Experiment A]

A diode with lead thermals was placed between two glass plates (5 mm in thickness and 3 mm in distance between the two glass plates), with the space being sealed with EVA resin, and then temperature changes caused by applying of electric current to the diodes were measured. For the measurement, the EVA resin was removed through a small hole made in one of the glass plates and then a thermocouple was fixed to the backside of the N thin part (i.e., the back side of the surface connected to the diode chip) with epoxy resin.

Said glass plates as a whole were put in an 80° C. constant-temperature chamber. After the constant temperature was obtained, a steady load current was applied for one hour. Then the temperature was measured. A series of the experiments was carried out in such a way that 30 minutes is left before the next load current is applied.

The diodes with lead terminals that were used for EXPERIMENT A are diodes with lead terminals 1 described in FIG. 2. For experiment example 1, a diode with lead terminals to which a diode chip of 5.5 mm×5.5 mm was connected was used; and for experiment example 2, two diode with lead terminals to which a diode chip of 2.7 mm×2.7 mm was connected (the two diode were connected in parallel using a ribbon-shaped cable of 3.5 mm in width and 0.2 mm in thickness) were used. In EXPERIMENT A, the experiment and measurement were carried out once for each of the experiment examples. The diode chips used were 0.23 mm in thickness (diode chips having the same thickness were used also for EXPERIMENTS B and C)

Table 1 shows the measurements of each experiment example (temperature: ° C.). In the table, the measurements for each of two diodes in experiment example 2 are separately shown as experiment example 2-1 and experiment example 2-2.

TABLE 1

|  |  | Current (A) | | | |
| --- | --- | --- | --- | --- | --- |
|  |  | 4 | 6 | 8 | 10 |
| Experiment example 1 | Single 5.5 | 108.0 | 121.0 | 133.5 | 145.0 |
| Experiment example 2-1 | Parallel 2.7 | 97.0 | 106.9 | 116.1 | 125.4 |
| Experiment example 2-2 | Parallel 2.7 | 101.4 | 114.8 | 127.2 | 139.1 |

Vf and Ir values of each of the diodes obtained in pulse 2 msec after the measurement confirmed that there was no damage to the diodes. The temperatures of the diode chips used were all below the rated Tj (170° C.) in both experiment 1 and experiment 2 even at the loaded current of 10 A. The table shows that in experiment example 2, where two diodes with lead terminals were connected in parallel, the temperature rise of the parallel connecting diode with lead terminals was more effectively restrained.

[Experiment B]

A diode with lead thermals and a parallel connecting diode with lead terminals were placed between two glass plates, and then temperature changes caused by applying of electric current to the diodes were measured. Glass plates, sealing, and a method for measuring temperature in this experiment were the same as those in EXPERIMENT A. A thermocouple was fixed using aluminum adhesive tape instead of epoxy resin used in EXPERIMENT A. The aluminum adhesive tape was used also in COMPARATIVE EXPERIMENT C.

The temperature of the constant-temperature chamber was set at 75° C. The load current was set from 5 A, every 1 A, to 10 A. A steady load current was applied for one hour. After that the temperature was measured. Immediately after the measurement was completed, the next load current was applied for the next experiment.

The diodes with lead terminals that were used for EXPERIMENT B were diodes with lead terminals 1 described in FIG. 3. For experiment example 3, a diode with lead terminals to which a diode chip of 3.5 mm×3.5 mm was connected was used;

for experiment example 4, a diode with lead terminals to which a diode chip of 4.6 mm×4.6 mm was connected was used; and for experiment example 5, a diode with lead terminals to which a diode chip of 5.5 mm×5.5 mm was connected was used.

Furthermore, the parallel connecting diodes with lead terminals that were used for EXPERIMENT B were parallel connecting diodes with lead terminals 5 described in FIG. 5. For experiment example 6, a diode with lead terminals to which a diode chip of 4.6 mm×4.6 mm was connected was used; and for experiment example 7, a diode with lead terminals to which a diode chip of 5.5 mm×5.5 mm was connected was used. In EXPERIMENT B, 5 samples were manufactured and tested for each experiment example.

Table 2 shows the measurements of each experiment example (temperature: ° C.). The averages of five measurements for each of experiment examples 3, 4, and 5 are shown in the table. Concerning experiment examples 6 and 7, the values obtained by averaging the actual measurements of two diodes connected in parallel were used as measured values. The averages of said five values are shown in the table. The measurements after 7 A and 9 A current loading were omitted.

TABLE 2

|  |  | Current (A) | | | |
| --- | --- | --- | --- | --- | --- |
|  |  | 5 | 6 | 8 | 10 |
| Experiment example 3 | Single 3.5 | 111.2 | 117.7 | 130.7 | 141.8 |
| Experiment example 4 | Single 4.6 | 105.1 | 110.5 | 121.2 | 131.5 |
| Experiment example 5 | Single 5.5 | 104.4 | 109.9 | 119.9 | 129.7 |
| Experiment example 6 | Twin 4.6 | 98.8 | 103.2 | 111.5 | 120.0 |
| Experiment example 7 | Twin 5.5 | 97.9 | 102.1 | 110.1 | 118.1 |

Vf and Ir values of each of the diodes obtained in pulse 2 msec after the measurement confirmed that there was no damage to the diodes. The temperatures of the diode chips used were all below the rated Tj (170° C.) in experiment examples 3 to 7 even at the loaded current of 10 A. The table shows that in experiment examples 6 and 7, the temperature rise of the parallel connecting diode with lead terminals was more effectively restrained.

[Comparative Experiment C]

The diode with lead terminals was placed between two glass plates, and then temperature changes caused by applying of electric current to the diode were measured. An EVA resin plate of 0.65 mm in thickness was placed on one glass plate, and then the diode with lead terminals was arranged on said EVA resin plate. After that another EVA resin plate of the same thickness was placed on said diode, and then another glass plate was clamped. In this way the diode with lead terminals was encapsulated. The method for measuring the temperature was the same as in experiment example 1.

The temperature of the constant-temperature chamber was set at 75° C. The load current was set from 5 A, every 1 A, to 10 A. A steady load current was applied for one hour, and then the temperature was measured. Immediately after the measurement was completed, the next load current was applied for the next experiment.

The size of each part of the parallel connecting diode with lead terminals used for COMPARATIVE EXPERIMENT C is as follows:

N substrate part: 0.5 mm in thickness, 5 mm in width, 39 mm in length

P substrate part: 0.5 mm in thickness, 5 mm in width, 39 mm in length

Therefore, the total of the plane area of the N substrate part and that of the P substrate part was 390 mm². The other dimensions are the same as those of the diode with lead terminals 4. In comparative experiment C, 3 samples were manufactured and tested for each experiment.

Table 3 shows the measurements of each comparative experiment examples (temperature: ° C.). The measurements for each of three samples are separately shown in the table. The measurements after 7 A and 9 A current loading were omitted.

TABLE 3

|  | Current (A) | | | | | |
| --- | --- | --- | --- | --- | --- | --- |
|  | 5 | 6 | 7 | 8 | 9 | 10 |
| Comparative experiment example 1-1 | 136.6 | 147.2 | 157.2 | — | — | — |
| Comparative experiment example 1-2 | 148.0 | 160.3 | 167.4 | 173.6 | 182.1 | — |
| Comparative experiment example 1-3 | 139.6 | 151.0 | 161.7 | 171.5 | — | — |

In comparative experiment example 1-1, when a 8 A current was being applied, the temperature dropped rapidly after it reached 160° C. In comparison experiment example 1-2, when a 10 A current was being applied, the temperature dropped rapidly after it reached 188° C. In comparison experiment example 1-3, when a 9 A current was being applied, the temperature repeatedly went up and down after it reached 180° C. In all comparison experiment examples 1-1, 1-2, and 1-3, it is assumed that any functional disorder occurred to the diodes when the temperature dropped.

INDUSTRIAL APPLICABILITY

The diode with lead terminals of the present invention is used as a CST bypass diode or a reverse-current preventive diode of the solar cell module. The parallel connecting diode with lead terminals of the present invention is preferably used, for example, as a CST bypass diode or a reverse-current preventive diode of the solar cell module, and furthermore, it may be used also as a general-purpose diode. The solar cell module of the present invention is used as a component part of a solar cell array. The terminal box of the present invention is used to receive output of a solar cell module.

What is claimed is:

1. A diode with lead terminals for use as a bypass diode connected in parallel to a cell string in which m solar cell cells m is a positive integer of 2 or more, are connected in series via a conductor or as a reverse-current preventive diode connected in series to n said cell strings, n is a positive integer of 1 or more, comprising, a rectangular plate-shaped conductive N terminal which has a portion of uniform thickness being between 0.8 mm and 2.0 mm thick, at each end of which a thin part is formed, said portion of uniform thickness being an N substrate part, and said thin part at one end being an N thin part and said thin part at the other end being an N connecting wire receiving part, and the under surface of the N substrate part, the under surface of the N thin part, and the under surface of the N connecting wire receiving part forming the same plane, a rectangular plate-shaped conductive P terminal which has a portion of uniform thickness as thick as the N substrate part, said portion of uniform thickness being a P substrate part, and said thin part at one end being a P thin part, said thin part at the other end being a P connecting wire receiving part, and the upper surface of the P substrate part and the upper surface of the P thin part forming the same plane, and the under surface of the P substrate part and the under surface of the P connecting wire receiving part forming the same plane, and a plate-shaped diode chip with a pn connection structure in which a flat plate-shaped P-type semiconductor is connected to a flat plate-shaped N-type semiconductor, wherein the electrode surface of the N-type semiconductor of said diode chip is connected to the upper surface of the N thin part of the N terminal and the electrode surface of the P-type semiconductor of said diode chip is connected to the under surface of the P thin part, in the state where said diode chip is connected, the overlapped portion of the N thin part, the diode chip, and the P thin part has almost the same thickness as the thickness of the N substrate part, and a total plane area of a plane area of the N substrate part and a plane area of the P substrate part is between or equal to 200 mm$^2$ and 1200 mm$^2$.

2. A diode with lead terminals according to claim 1, wherein said thin part of said N terminal and/or said P terminal is formed by means of etching.

3. A diode with lead terminals according to claim 1, wherein electric insulating member is added to the side of said diode chip.

4. A solar cell module, wherein the diode with lead terminals of claim 1, together with said solar cells, is sealed between a front surface material and a rear surface material where the solar cells is to be sealed.

5. A solar cell module according to claim 4, wherein two or more diodes with lead terminals of claim 1 are connected in parallel to the connecting point of said single bypass diode and/or said single reverse-current preventive diode.

6. A terminal box for solar cell receiving output of the solar cell module, in which the diode with lead terminals of claim 1 is arranged as said bypass diode and/or said reverse-current preventive diode.

7. A terminal box for solar cell module of claim 6, wherein two or more diodes with lead terminals of claim 1 are connected in parallel to the point of said single bypass diode and/or said single reverse-current preventive diode.

8. A parallel connecting diode with lead terminals for use as a bypass diode connected in parallel to a cell string in which m solar cell cells, m is a positive integer of 2 or more, are connected in series via a conductor or as a reverse-current preventive diode connected in series to n said cell strings, n is a positive integer of 1 or more comprising, a plate-shaped conductive N terminal of uniform thickness of between or equal to 0.8 mm and 2.0 mm, having an N bridge part extending in the forward and backward directions and a plurality of N substrate parts extending from the N bridge part in the right and left direction with an N thin part at each end thereof, the under surface of the N substrate part and the under surface of the N thin part forming the same plane, a plate-shaped conductive P terminal of the same thickness as the N substrate part, having a P bridge part extending in the forward and back directions and the same quantity of a P substrate part as the quantity of the N substrate part, extending from the P bridge part in the right and left direction with a P thin part at each end thereof, the upper surface of said P substrate part and the upper surface of the P thin part forming the same plane, and the same quantity of plate-shaped diode chips as the quantity of the N substrate part, with a pn connection structure in which a flat plate-shaped P-type semiconductor is connected to a flat plate-shaped N-type semiconductor, wherein the N thin part and the P thin part face to each other, the electrode surface of the N-type semiconductor of one of said diode chips being connected to the upper surface of the N thin part, and the electrode surface of the Ptype semiconductor of the same one of the said diode chips being connected to the under surface of the P thin part;

in the state that said diode chips are connected, the overlapped portion of the N thin part, the diode chip, and the P thin part has almost the same thickness as the thickness of the N substrate part, a total plane area of a plane area of the N substrate part and a plane area of the P substrate part, in which the two substrate parts constitute a pair, is between or equal to 200 mm$^2$ and 1200 mm$^2$, having an N connecting wire receiving part which is a thin part formed at the N bridge part or the N substrate part, and the under surface of the N substrate part and the under surface of the N connecting wire receiving part forming the same plane, and having a P connecting wire receiving part which is a thin part formed at the P bridge part or the P substrate part, and the under surface of the P substrate part and the under surface of the P connecting wire receiving part forming the same plane.

9. A parallel connecting diode with lead terminals for use as a bypass diode connected in parallel to a cell string in which m solar cell cells, in is a positive integer of 2 or more, are connected in series via a conductor or as a reverse-current preventive diode connected in series to n said cell strings, n is a positive integer of 1 or more, comprising, a plate-shaped conductive N terminal of uniform thickness of between or equal to 0.8 mm and 2.0 mm, having an N bridge part extending in the forward and backward directions and a plurality of N substrate parts extending from the N bridge part in the right and left direction with an N thin part at each end thereof, the under surface of the N substrate part and the under surface of the N thin part forming the same plane, a plate-shaped conductive P terminal of the same thickness as the N substrate part, having a P bridge part extending in the forward and back directions and the same quantity of a P substrate part as the quantity of the N substrate part, extending from the P bridge part in the right and left direction with a P thin part at each end thereof, the upper surface of said P substrate part and the upper surface of the P thin part forming the same plane, and the same quantity of plate-shaped diode chips as the quantity of the N substrate part, with a pn connection structure in which a flat plate-shaped P-type semiconductor is connected to a flat plate-shaped N-type semiconductor, wherein the N thin part and the P thin part face to each other, the electrode surface of the N-type semiconductor of one of said diode chips being connected to the upper surface of the N thin part, and the electrode surface of the P-type semiconductor of the same one of said diode chips being connected to the under surface of the P thin part;

in the state that said diode chips are connected, the overlapped portion of the N thin party the diode chip, and the P thin part has almost the same thickness as the thickness of the N substrate part;

a total plane area of a plane area of the N substrate part and a plane area of the P substrate part, in which the two substrate parts constitute a pair, is between or equal to 200 mm$^2$ and 1200 mm$^2$, having an N connecting wire receiving part which is a thin part formed extending from the N bridge part or the N substrate part, and the under surface of the N substrate part and the under surface of the N connecting wire receiving part forming the same plane, and having a P connecting wire receiving part which is a thin part formed extending from the P bridge part or the P substrate part, and the under surface of the P substrate part and the under surface of the P connecting wire receiving part forming the same plane.

10. A parallel connecting diode with lead terminals according to claim 9, wherein said thin part of the N terminal and/or the P terminal is formed by means of etching.

11. A parallel connecting diode with lead terminals according to claim 9, wherein an electric insulating member is added to the side of said diode chip.

12. A solar cell module, wherein the parallel connecting diode with lead terminals of claim 9, together with said solar cells, is sealed between a surface material and a rear surface material, where the solar cells are to be sealed.

13. A terminal box for solar cells for receiving the output of the solar cell module, wherein the parallel connecting diode with lead terminals of claim 9 is arranged as said bypass diode and/or said reverse-current preventive diode in said terminal box for solar cells.

* * * * *